United States Patent
Abou-Allam et al.

[11] Patent Number: 6,094,084
[45] Date of Patent: Jul. 25, 2000

[54] NARROWBAND LC FOLDED CASCODE STRUCTURE

[75] Inventors: Eyad Abou-Allam, Waterloo; Tajinder Manku, Kitchener; Michael Maliepaard, Stittsville, all of Canada

[73] Assignee: Nortel Networks Corporation, Montreal, Canada

[21] Appl. No.: 09/148,135

[22] Filed: Sep. 4, 1998

[51] Int. Cl.[7] .................................................. G06F 7/44
[52] U.S. Cl. ...................... 327/359; 327/356; 455/326; 455/333
[58] Field of Search .................... 327/356, 357, 327/359, 52, 65, 77, 78; 455/326, 333

[56] References Cited

U.S. PATENT DOCUMENTS

| | | | |
|---|---|---|---|
| 4,628,284 | 12/1986 | Bruning et al. | 331/86 |
| 5,495,194 | 2/1996 | Sugawara | 327/356 |
| 5,502,420 | 3/1996 | Barclay | 332/135 |
| 5,621,362 | 4/1997 | McKinney et al. | 331/117 |
| 5,901,350 | 5/1999 | Stoichita et al. | 327/359 |

OTHER PUBLICATIONS

P.J. Sullivan, "Low Voltage Performance of a Microwave CMOS Gilbert Cell Mixer", IEEE Journal of Solid State Circuits, vol. 32, No. 7 Jul. 1997, pp. 1151–1155.

Jan Crols, et al., "A 1.5 GHz Highly Linear CMOS Downconversion Mixer", IEEE Journal of Solid State Circuits vol. 30, No. 7 Jul. 1995, pp. 736–742.

Derek K. Shaeffer, et al., "A 1.5V, 1.5 GHz CMOS Low Noise Amplifier", IEEE Journal of Solid State Circuits, vol. 32, No. 5, May 1997, pp. 745–759.

Asad A. Abadi, "Direct–Conversion Radio Transceivers for Digital Communications", IEEE Journal of Solid State Circuits vol. 30, No. 12 Dec. 1995, pp. 1399–1413.

Abmadreza Rofougaram, et al., "A 1 GHz CMOS RF Front–End IC for a Direct–Conversion Wireless Receiver", IEEE Journal of Solid State Circuits vol. 31, No. 7, Jul. 1996, pp. 880–892.

Jan Crols, et al., "A Single–Chip 900 MHz CMOS Receiver Front–End with a High Performance Low–IF Topology", IEEE Journal of Solid State Circuits vol. 30, No. 12, Dec. 1995, pp. 1483–1492.

*Primary Examiner*—Jung Ho Kim

[57] ABSTRACT

A low voltage cascode frequency conversion mixer circuit is provided. In place of a conventional current source, an LC tank circuit is used. This makes the circuit function as a mixer only over a narrow band of frequencies centred at the resonance frequency of the LC tank circuit. The circuit mixes an input signal with a local oscillator signal. Advantageously, a lower supply voltage may be used because a smaller DC drop exists across the tank circuit than does across conventional current sources. The circuit may also be used as an amplifier by connecting a DC bias voltage in place of the local oscillator.

20 Claims, 6 Drawing Sheets

NARROWBAND LC FOLDED CASCODE STRUCTURE

FIELD OF INVENTION

The invention relates to mixer and amplifier circuits used for example with personal radio communication devices and more particularly to mixer and amplifier circuits with reduced voltage supply requirements.

BACKGROUND OF THE INVENTION

The use of personal wireless radio communications systems, such as digital cellular telephones, operating in frequency bands between 900 MHZ and 5800 MHZ, is expanding at a fast rate. One of the key issues in the success of wireless hardware is the overall size and weight of hand-held battery operated devices. Much of the bulk of such devices is contributed by a power source, typically a battery pack. If the size of the battery pack in the enclosure of the hand-held device could be reduced, the volume saved could be used to implement other features or functions without increasing the overall size of the device and would probably also result in a decrease in the weight of the device. The size of the battery pack is dictated mainly by the operating voltage of the wireless terminal. In order to reduce the size and weight, it is desirable to reduce the required supply voltage of active circuitry used in such devices.

In many communications systems, specifically wireless communications systems, an information signal is modulated onto a higher frequency carrier before being transmitted. In these systems, there is often a need at the receiver end for some form of frequency translation back to lower frequencies. A decision device is then used to recover the information contained in the lower frequency signal. The frequency translation is often performed using frequency mixers.

Frequency mixers are important building blocks in transceiver design since the dynamic range and noise/distortion performance of a transmitter/receiver is determined, and often limited, by the first up-down-conversion mixer.

The design of mixers forces many compromises between conversion gain, local oscillator performance, linearity, noise figure, port-to-port isolation, voltage supply and power consumption. There are several types of mixer design used in the industry, probably one of the more popular being the Gilbert mixer. The Gilbert mixer has a structure which is based on the application of the well-known cascode structure (also known as a totem pole or tree structure), which, although providing a stable and approximately linear performance, has a disadvantage of requiring a relatively high voltage to operate.

SUMMARY OF THE INVENTION

It is the object of the invention to obviate or mitigate one or more of the above-identified disadvantages.

A cascode structure for use as a mixer or amplifier is provided which is capable of operating reliably with a supply of a very low voltage. In one embodiment, a new low voltage topology for a Radio Frequency (RF) mixer circuit is fabricated using a complementary metal oxide silicon (CMOS) process. The inventive topology includes CMOS transistors and RF tank circuits (resonant circuits) to reduce the supply voltage requirements. This is achieved with virtually no degradation of performance.

According to a first broad aspect, the invention provides an apparatus comprising: a tank circuit having a resonance frequency, having a first end for connection to a first supply terminal and having a second end, the tank circuit consisting of a narrowband complex impedance having a very low DC resistance and having a high impedance in a range of frequency around said resonance frequency; an n-channel MOS transistor having a gate for receiving a first input signal, and a drain connected to the second end of the tank circuit; a p-channel MOS transistor having a drain for connection across a load to a second supply terminal, a source connected to the second end of the tank circuit, and a gate for receiving a second input signal; wherein the circuit multiplies the second input signal with the first input signal only within said range of frequency.

According to a second broad aspect, the invention provides an apparatus comprising: a tank circuit having a resonance frequency, having a first end for connection to a first supply terminal and having a second end, the tank circuit consisting of a narrowband complex impedance having a very low DC resistance and having a high impedance in a range of frequency around said resonance frequency; a first transistor having first, second and third terminals, with the first terminal for receiving a first input signal, and the second terminal connected to the second end of the tank circuit; a second transistor of complementary type to said first transistor having first, second and third terminals, with the second terminal for connection across a load to a second supply terminal, the third terminal connected to the second end of the tank circuit, and the first terminal for receiving a second input signal; wherein the circuit multiplies the second input signal with the first input signal only within said range of frequency.

According to a third broad aspect, the invention provides an apparatus comprising: a first tank circuit having a very low DC resistance and having a high impedance in a range of frequency around a resonance frequency, and having a first end for connection to a first supply terminal and having a second end; a second tank circuit having a very low DC resistance and having a high impedance in said range of frequency and having a first end for connection to the first supply terminal and having a second end; a first transistor having first, second and third terminals, the second terminal connected to the second end of the first tank circuit, the third terminal for connection to a second supply terminal and the first terminal for receiving a first end of a first differential input signal; a second transistor of the same type as said first transistor and having first, second and third terminals, the second terminal connected to the second end of the second tank circuit, the third terminal for connection to the second supply terminal, and the first terminal for receiving a second end of said first differential input signal; a first differential pair of transistors of complementary type to said first and second transistors, and each of the pair having respective first, second and third terminals, the third terminals connected together and to the second end of the first tank circuit, the first terminals for connection to a second differential input signal, one of said second terminals for connection to the second supply terminal through a first load; and a second differential pair of transistors of the same type as said first differential pair of transistors, and each of the pair having respective first, second and third terminals, the third terminals connected together and to the second end of the second tank circuit, the first terminals of the first differential pair cross-connected with the first terminals of the second differential pair, one of said second terminals for connection to the second supply terminal through a second load; the second terminals of the first differential pair being cross-connected with the second terminals of the second differential pair.

DETAILED DESCRIPTION OF THE PREFERRED EMBODIMENTS

Figure 1:
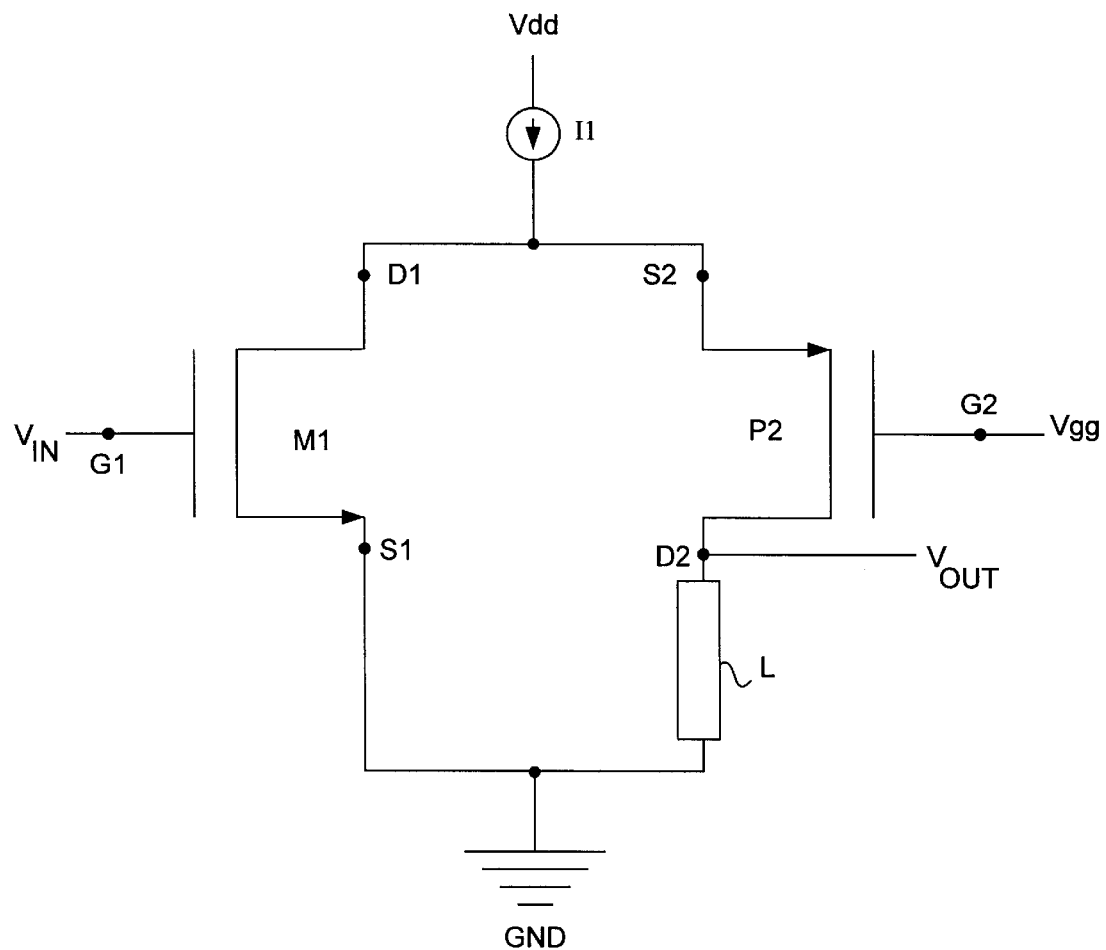
FIG. 1 is a circuit diagram for a conventional folded cascode circuit topology.

Referring now to FIG. 1, a conventional folded cascode structure will be described. The folded cascode structure of FIG. 1 in this example consists of an n-channel MOS transistor M1 with a source terminal S1 connected to a ground terminal GND, a gate terminal G1 of transistor M1 connected to receive an input signal Vin, and a drain terminal D1 of transistor M1 connected to a source terminal S2 of a p-channel MOS transistor P2. Transistor P2 also has a gate terminal G2 connected to receive a bias signal Vgg and a drain terminal D2 connected through a load L to ground terminal GND, the circuit output Vout also being taken at the drain terminal D2. The source terminal S2 (and drain terminal D1) are also connected through a current source I1 to a supply terminal Vdd. Current source I1 provides the bias current for both M1 and P2.

In FIG. 1, the common source transistor M1 is used as the amplifying device. This transistor is normally designed and optimized to achieve a low noise figure. This is crucial since the most unfavourable signal-to-noise ratio can be found where the signal swing is the smallest, typically at the input stages of a circuit.

The common gate transistor P2 is used as a current buffer and serves two objectives. Firstly, it isolates the input terminal from the output terminal (i.e. reduces the reflected power from the output by reducing the S12 parameter of the circuit). This is crucial for achieving good stability of the device and allows for a reliable impedance matching at the input terminal. Secondly, the voltage gain across the gate drain capacitance of M1 is reduced, reducing the effective input capacitance and increasing the circuit bandwidth.

The conventional current source I1 is implemented using a p-channel MOS transistor with a DC bias voltage applied on the gate terminal. In this case, the transistor should operate in the saturation (also know as pinch-off) mode.

The circuit of FIG. 1 can be used as an amplifier or a frequency conversion mixer. When the circuit is operating as an amplifier, the Vdd terminal is connected to the positive terminal of a power supply while the point labelled GND is connected to the negative terminal (or the ground) of the power supply. When a bias signal (DC voltage) is applied to the terminal Vgg and a message signal is introduced to the terminal Vin, the latter signal is amplified producing an output signal Vout of the same fundamental frequencies as the input signal Vin.

When the circuit of FIG. 1 is operating as a mixer, the Vdd terminal is connected to the positive terminal of a power supply while the point labelled GND is connected to the negative terminal (or the ground) of the power supply. When a first signal is introduced to the terminal Vgg which is made alternating in time (typically a periodic sinusoidal or square wave) in contrast to a pure DC bias signal (DC voltage) and a second signal is introduced to the terminal Vin, these two signals will mix producing a composite signal Vout suitable for transmission or reception.

The cascode structure, because of its simplicity, good linearity and good bandwidth, is used in most integrated low noise devices and forms the basic core element of various amplifier and mixer circuits. Non-folded cascode topologies (not shown) rely on stacking two (or more) transistors between the supply rails. The folded topology of FIG. 1 differs from the non-folded Cascode topology in that P2 is a device of complementary type to M1 and does not share the same DC bias current as M1.

Figure 2:
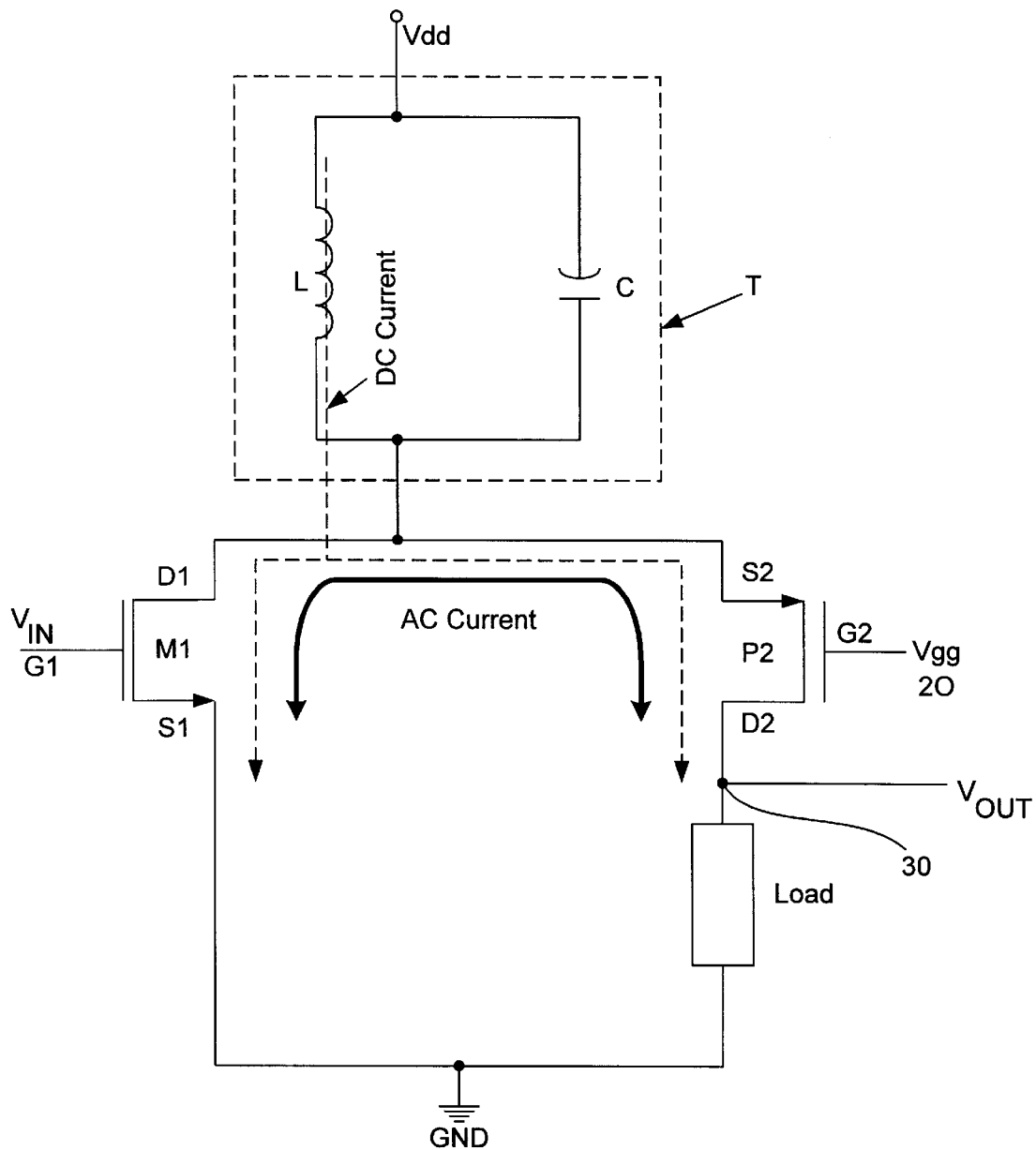
FIG. 2 is a circuit diagram of a narrow-band folded cascode circuit according to an embodiment of the invention.

A narrowband folded cascode structure according to an embodiment of the invention is shown in FIG. 2. This circuit differs from that of FIG. 1 in that an LC tank circuit T is connected between the drain D1 of M1 (and the source S2 of P2) and the supply terminal Vdd. The LC tank circuit T consists of an inductor L and a capacitor C connected together in parallel. This achieves two main objectives. Firstly, this gives the cascode structure a narrowband characteristic. Secondly, there is no DC voltage drop across the LC tank circuit T and as such a smaller Vdd may be employed, meaning that fewer or smaller batteries would be required. The LC tank circuit T is tuned to a particular frequency range of interest.

The two devices M1 and P2 do not share the same current, and therefore the DC bias currents in the two devices M1 and M2 are independent of each other.

For the operation of the circuit, the parallel LC tank circuit T must provide (at resonance) an impedance higher than that of the input resistance seen at the source of P2. It can be shown that this requirement is satisfied by choosing the bias point of P2 such that its small signal transconductance gm2 satisfies the following condition:

$$gm2 > \frac{RpC}{L}$$

where Rp is the parasitic resistance of the metal lines used to construct the inductor.

The circuits of FIGS. 1 and 2 differ in their operation, the fundamental differences being in their range of operating frequencies and their power supply requirements. The conventional folded cascode topology is wideband in nature and operates well for frequencies ranging from DC to very high frequencies. This leads to often elaborate schemes to filter out unwanted products of frequency mixing. In addition, the conventional folded cascode topology requires a higher power supply voltage to accommodate the current source.

For most wireless applications, the signals of interest are within a narrow bandwidth (e.g. 25 MHZ for most Personal Communications Systems (PCS) applications) and are centred around a much higher RF carrier (e.g. 1.9 GHz). Therefore, there is no need for the wideband operation of the conventional cascode topology.

The innovative topology is a narrowband folded cascode topology operating on a small band of frequencies centred around the RF signal frequency. The message signal is introduced to the terminal Vin causing a current signal of the same frequency to appear at drain terminal D1 of transistor M1. The tank circuit T is designed such that the resonance frequency is within the RF bandwidth. When the signal frequency is within the RF bandwidth, the tank circuit T provides a high impedance which forces the current signal to flow into the source terminal S2 of transistor P2. Therefore, the tank circuit T performs the same function as the current source I1 in the convention folded cascode topology of FIG.

1; this is true only for the bandwidth interest. When the signal is of frequencies much higher or lower that the above mentioned bandwidth, the tank circuit provides a low impedance to the power supply terminals and only a residual part of the signal appears at the output. Note that this circuit could be used as a narrowband mixer or as a narrowband amplifier, depending on the signal applied on the terminal Vgg. If this signal is a DC bias signal, then the circuit is a narrowband folded cascode amplifier. If this signal is made alternating in time (typically a sinusoidal or square wave) then the two signals on Vgg and Vin are mixed together to produce the output Vout. The new topologies require less supply voltage. This is true because the topologies do not require a current source to bias the transistors. Instead, the inductor in the tank circuit is used to provide a path for the DC current required for biasing the transistors M1 and P2 (FIG. 2). Since the inductor does not cause a DC voltage drop across its terminals the overall supply voltage Vdd can be made lower. The amount of supply voltage reduction is equivalent to the DC voltage drop required across the current source I1 in FIG. 1, this typically being on the order of 0.5 V to 1 V.

Figure 3:
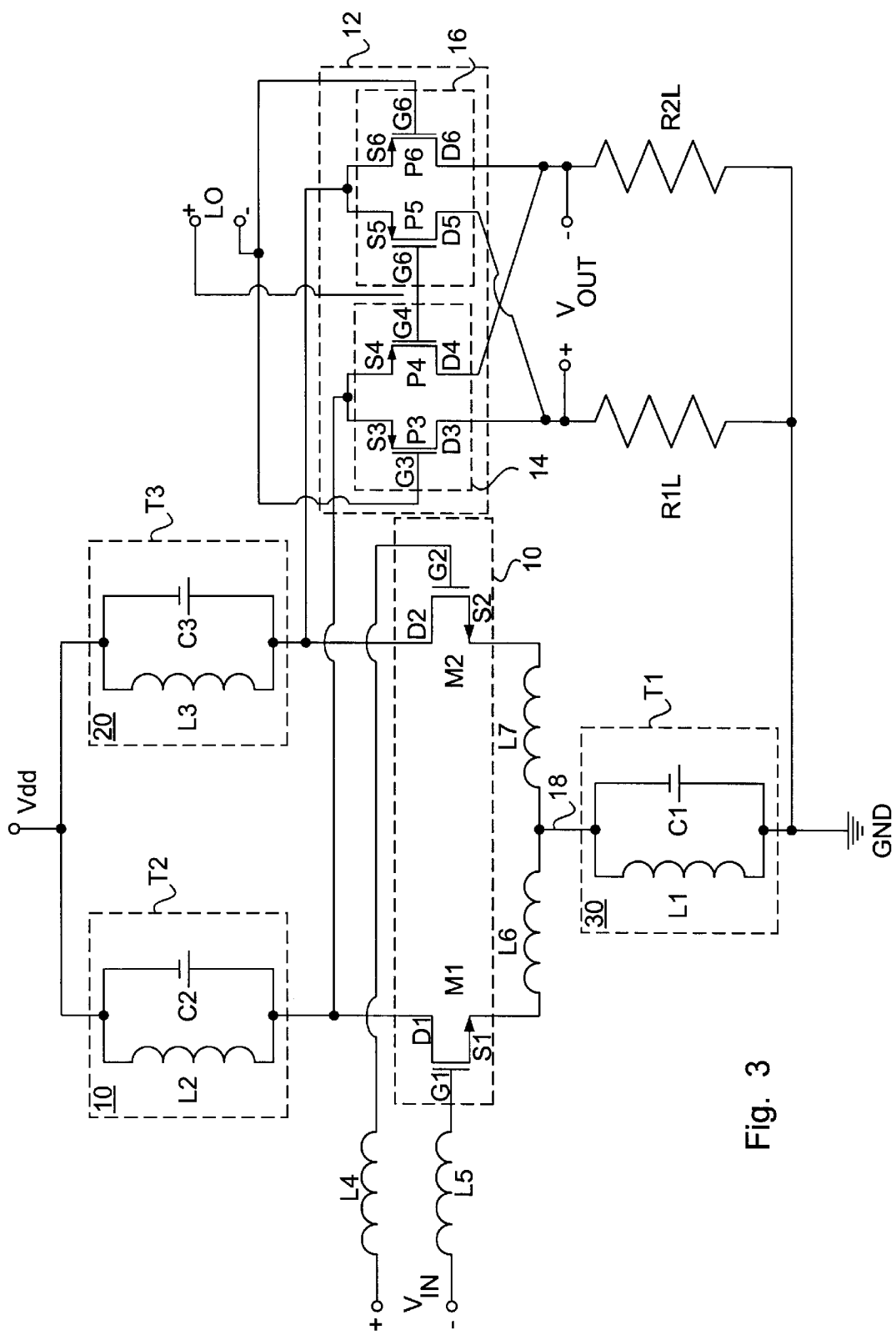
FIG. 3 is a circuit diagram of a balanced mixer according to an embodiment of the invention which uses the narrow-band folded cascode circuit of FIG. 2.

Referring now to FIG. 3, a narrowband folded cascode mixer according to another embodiment of the invention will be described. The narrowband LC folded cascode mixer has an input stage 10 which in the illustrated example is an input differential pair consisting of two n-channel MOS transistors M1, M2 whose sources are connected through inductors L6, L7 respectively to one end of a tank circuit T1, the other end of tank circuit T1 being connected to a ground terminal GND. The narrowband folded cascode mixer has a mixing stage which in the illustrated example is a mixing transistor quad 12 consisting of p-channel MOS transistors P3, P4, P5, P6 configured as a pair of cross-coupled differential pairs 14,16. The sources S3,S4 of transistors P3, P4 are connected together and to the drain D1 of transistor M1. Similarly, the sources S5,S6 of transistors P5,P6 are connected together and to the drain of transistor M2. The drains D3,D5 of transistors P3,P5 are connected together and across a load resistance R1L to ground (GND), and the drains D4,D6 of transistors P4,P6 are connected together and across a load resistance R2L to ground (GND). The sources S3,S4 of the first mixing differential pair P3,P4 are connected through a tank circuit T2 to the supply terminal Vdd, and the sources S5,S6 of the second mixing differential pair P5,P6 are connected through a tank circuit T3 to the supply terminal Vdd. The tank circuits T1,T2,T3 consist of parallel LC circuits, with T1 consisting of L1,C1, T2 consisting of L2,C2 and T3 consisting of L3,C3. The differential input signal Vin (vin−,vin+) is connected to the gates G1,G2 of the input differential pair M1,M2 through inductors L4,L5. Preferably, the three tank circuits T1,T2,T3 are identical.

By connecting the input to the gates G1,G2 of transistors M1 and M2 through inductors L4 and L5, the input reactance of these transistors is set to zero by tuning out the input capacitance of the RF input.

The inductor L1 of the tank circuit T1 provides a path for the DC bias current. This DC current is needed to bias the transistors M1 and M2 in their operating point. Since the DC resistance of an inductor is typically very small, this path of the bias current requires minimum (almost zero) voltage drop across the tank circuit which helps in reducing the power supply voltage.

The tank circuit T1 is designed to have a resonance frequency and bandwidth equivalent to the RF frequency and bandwidth of the RF signal. Within this band of frequencies, the tank circuit T1 provides a high impedance branch. This results in a common-mode node 18 for signals at that particular frequency. Therefore, transistors M1 and M2 act as a source coupled differential pair at that particular bandwidth with high differential gain and low common-mode gain. This is particularly useful in making the mixer balanced within the RF band of interest.

Noiseless source degeneration and impedance matching at the RF terminal are accomplished using the inductors L6,L7. These inductors serve two objectives. Firstly, they create a real valued input impedance without introducing a significant amount of noise to the circuit. Secondly, they provide negative feedback to the configuration which helps to reduce signal distortion. The advantage in using inductors in this design is that they exhibit (almost) no resistance and therefore (almost) no DC voltage drop. Inductors manufactured in CMOS processes are (almost ideally) noiseless.

Transistors M1 and M2 serve as voltage to current converters, and hence perform the same function as their equivalents in conventional Gilbert mixers. Since the transistors M1 and M2 are used as the RF input stage, they are designed and fabricated to achieve a low noise performance.

The tank circuits T2 and T3 are used as loads for the input stage 10 as well as current sources for the mixing quad 12. The resonance frequency of all tank circuits in this design is set to equal the frequency of the RF signal. For tank circuit T2, the resonance frequency is defined by the following equation:

$$f_{RF} = \frac{1}{2\pi\sqrt{L2(C2 + Cgd1 + Cgs3 + Cgs4 + Cp)}}$$

where Cgd1 is the gate-drain capacitance of transistor M1, Cgs3 and Cgs4 are the gate-source capacitances of transistors P3 and P4, and Cp is the parasitic capacitance due to diffusion of drain and source terminals of transistors M1, P3 and P4 as well as the interconnect capacitance of this node. Similar equations can be written for the resonance frequencies of the tank circuits T1,T3.

It should be noted that the operation of the inventive circuitry input stage is different from that of the Gilbert mixer of prior art. In the traditional Gilbert mixer, the operation of the input stage is independent of the RF frequency. On the other hand, the inventive design operation is RF frequency dependent. At RF frequencies much lower or much higher than the resonance frequency the tank circuits have a low impedance relative to the transconductance of the transistors. Therefore, no voltage appears across the tank circuits T2 and T3 at these frequencies, hence no signal appears at the output IF. At the RF signal frequency, the tank circuits exhibit high impedance. The tank T1 provides a common-mode node for the sources of transistors M1 and M2. At the resonance frequency transistors M1 and M2 act as a source-coupled differential pair. This results in a high differential gain and a low common-mode gain. This is necessary for the mixer to be balanced and to minimize leakage between the local oscillator (LO) and the RF signals. At the RF frequency the tank circuits T2 and T3 provide a high impedance thus forcing the RF signal current to flow into the sources of the mixing quad P3,P4,P5,P6.

The mixing quad operates the same way as the mixing quads of a traditional Gilbert mixer. Each pair 14 (P3, P4) and 16 (P5, P6) act as a differential pair at the RF frequency since they are driven by a high impedance source. At frequencies other than the resonance frequency they do not act as differential pairs resulting in low differential gain and high common mode gain.

In a narrow band around the resonance frequency of the tank circuits the performance of this circuit is close to the operation of a traditional wide-band Gilbert mixer with the exception that a much lower Vdd voltage is needed for reliable operation.

Design Considerations for the Preferred Embodiment

1. Transistors M1 and M2 are n-channel devices used to connect to the RF signal in differential form. These devices convert the input voltage to a current signal in the same way they are used in a conventional Gilbert mixer. These transistors are designed to provide a high conversion gain and low noise performance. Two factors are involved in the design of these devices:

A. Device Dimensions: The device M1 and M2 should be of minimum gate length (as small as allowed by the fabrication process). The width of the devices should be identical and set to achieve the desired conversion gain while maintaining reasonably low distortion levels. Increasing the width of the device results in a higher conversion gain and higher distortion (less linearity). In most applications, the distortion in the mixer is the dominant factor. A typical recommended range for the (width/length) ratio is 200 to 600.

B. Bias Level: The transistors M1 and M2 have to be DC biased to provide a low noise performance. Best performance is achieved by biasing the devices at (or near) their maximum cutoff frequency $\omega_{\tau 1}$. The maximum value for $\omega_{\tau 1}$ of a MOS transistor is technology dependent.

2. Inductors L6 and L7 are identical to each other and are used for two reasons:

A. Input Impedance Matching: These inductors set the input resistance (Rin) level of the mixer. The resistance should be set equal to the resistance of the RF source, usually 50 Ω in most applications. The differential input resistance of the mixer is given by $$RIN = (\omega_{\tau 1}L6 + \omega_{\tau 1}L7 + R6 + R5 + 2Rs + 2Rg)$$

where R6 and R5 are the parasitic resistances of L6 and L5, respectively, Rs and Rg are the parasitic resistances of the source and gate terminals of M1 (or M2), and $\omega_{\tau 1}$ is the cutoff frequency of M1 and M2. The dominant term in the above equations should be $\omega_{\tau 1}$ (L6+L7). To minimize introduction of noise to the input of the mixer all parasitic resistances should be kept to a minimum. Since $\omega_{\tau 1}$ is chosen to be as high as possible, the value of L6 and L7 is chosen as small as possible. Typical values of L6 and L7 are in the order of 0.5 nH–2 nH. Having small on-chip inductance results in physically smaller inductors. This also leads to minimizing the parasitic resistance and capacitance of L6 and L7. The parasitic capacitance of L6 and L7 should be small enough such that the self resonance frequency of the inductor is much higher than the RF signal frequency.

B. Lower Distortion: The inductors L6 and L7 provide a proportional feedback to the input of the circuit. This results in a lower conversion gain and less distortion (higher linearity).

3. Inductors L4 and L5 are used to set the input reactance of the mixer to zero. This is done by tuning out the input capacitance of the mixer RF input. The values of these L4 and L5 are identical and determined by $$L4 = \frac{1}{\omega_{RF}^2 Cg1} - L6$$

where Cg1 is the total gate capacitance of M1 (or M2). Typical values for L4 and L5 are in the order of 8 nH–12 nH. The parasitic resistance of L4 and L5 cause a proportional degradation in the noise performance of the mixer. Also, the parasitic capacitance of L4 and L5 can cause errors in the input reactance of the mixer and may increase the noise. Therefore, these inductors may be left external to the chip to minimize their parasitic R's and C's.

4. The tank circuit formed by L1 and C1 is used to replace the current source in a double-balanced Gilbert mixer. It operates as follows:

A. At DC the capacitor provides an open circuit and the inductor allows the bias current of M1 and M2 to sink to ground. This path of the bias current requires minimum voltage drop across the inductor (only due to the parasitic resistance).

B. The parallel tank circuit (L1,C1) is designed to have a resonance frequency equal to RF signal.

$$\omega_{RF} = \frac{1}{\sqrt{(L1\ C1)}}$$

At the resonance (RF) frequency, the impedance of the tank circuit achieves a maximum value. The high impedance branch provided at resonance results in a common mode node "18" at that particular frequency. Hence, at RF the two transistors M1 and M2 act as a source coupled differential pair similar to the input differential pair in a Gilbert mixer. The common mode node "18" results in amplification of differential signals and suppression of common signals at the input terminals of the mixer. This common-mode rejection is essential for the mixer to be balanced at RF (note that the circuit is not balanced at frequencies much lower or higher than RF).

C. The operation described in point 4.B above is based on the fact that at resonance the tank circuit exhibits a high impedance. Because of the parasitic resistance and capacitance of the inductor L1, the impedance of the tank at RF can only be finite. However, for the circuit to be balanced, the impedance of the tank at RF should be higher than the impedance seen at the source terminals of M1 and M2. It can be shown that this condition is satisfied by designing the tank circuit such that $$gm1 > \frac{R1\ C1}{L1}$$

where gm1 is the small signal conductance of M1 (equal to M2) and R1 is the parasitic resistance of L1. Hence, this tank circuit should be designed with a high valued inductance (typically in the order of 4 nH–6 nH for 1.9 GHz applications). The inductor should, however, have the self resonance frequency (caused by the parasitic capacitance) much higher than that of RF signal.

5. The tank circuits of (L2,C2) and (L3,C3) are identical and used as follows:

A. Low impedance branches at DC due to the inductors. At DC the inductors L2 and L3 allow a path for the bias current of the n-channel devices (M1,M2) and the p-channel devices (P3–P6) to the supply rail Vdd. Since the inductors have a relatively low DC resistance, the supply current does not cause a significant voltage drop across the inductors.

B. These tank circuits are designed to resonate at the RF signal frequency. Therefore, they provide high impedance loads to the source coupled pair M1 and M2 at that particular frequency. In order to achieve a high impedance the tanks are designed with high valued inductors (typically 4 nH–6 nH for 1.9 GHz applications). The finite quality factor of the on-chip inductors due to the parasitic resistance and capacitance can result in a lower conversion gain than that of a conventional Gilbert mixers. Therefore, these parasitic should be kept to a minimum.

6. The four identical p-channel MOS devices (P3,P4,P5,P6) are used to replace the switching quad traditionally used in a Gilbert mixer. Their gates are driven by a switching signal from the local oscillator (LO). As the tank circuits of (L2,C2) and (L3,C3) provide a high impedance branch for RF signals, the RF current produced by M1 and M2 is forced to flow in the p-channel devices. In order for this to occur the tank circuits and the p-channel devices are designed such that:

$$gmp > \frac{R2\ C2}{L2}$$

where R2 is the parasitic resistance of L2 and gmp is the equivalent small signal transconductance of any of the p-channel transistors in their ON state. Only p-channel devices can be used since they provide a low impedance at their source terminals. As these transistors alternate in switching ON and OFF the RF signal current is down-converted to a lower intermediate frequency (IF) output. The load resistors R1L and R2L are used to transform the output current to a voltage. The values of these resistors are determined according to the required voltage gain and distortion levels.

In the preferred embodiment the inventive circuitry is fabricated using 0.5 μm CMOS technology.

Alternate fabrication technologies, dimensions of structures, other types of transistors and transistors complementary to those disclosed herein could be used to obtain the same or similar results. For example, the circuit described above can be implemented with most technologies that support two complementary type devices. Bipolar technology may be used for example in which case the n-channel MOS devices could be replaced by npn bipolar junction transistors and/or the p-channel devices could be replaced by pnp bipolar junction transistors. If a MOS transistor is replaced by a bipolar transistor the latter is connected such that the base, emitter, and collector terminals are in place of the gate, source, and drain terminal of MOS transistor, respectively. This double-balanced narrowband folded cascode frequency conversion mixer topology could be adapted for use in lower frequency circuits fabricated using discrete components, entirely or in part.

All the tank circuits are preferably designed as parallel tank circuits. If the bandwidth of the tank circuit is lower than the required bandwidth then alternative complex impedances may be employed. For example, it is possible to insert a resistance of real value in parallel with the L and C of the tank circuit and the operation of the circuits would be very similar except with a higher bandwidth. Another technique is to design a more complex RLC network to achieve this purpose. A large number of RLC networks are possible but to keep the low voltage operation of the circuit it is required that all RLC networks have a very low DC resistance between the signal terminal and the supply terminal. Such requirement is best met with an inductor.

The load of all proposed circuits can be made of either real or complex impedances depending of the application and the available technology.

Figure 4:
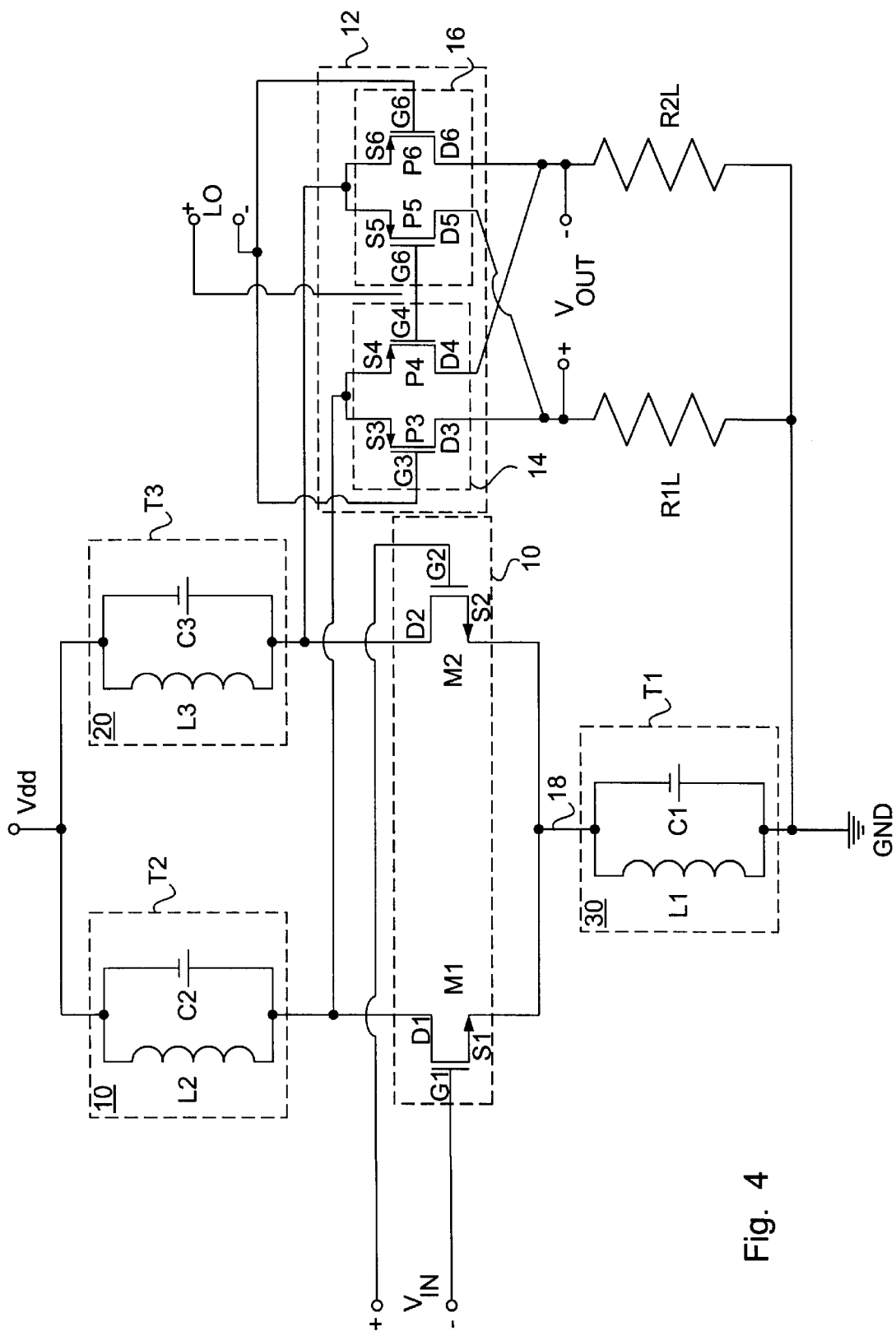
FIGS. 4–6 are variants of the balanced mixer of FIG. 3.
Figure 5:
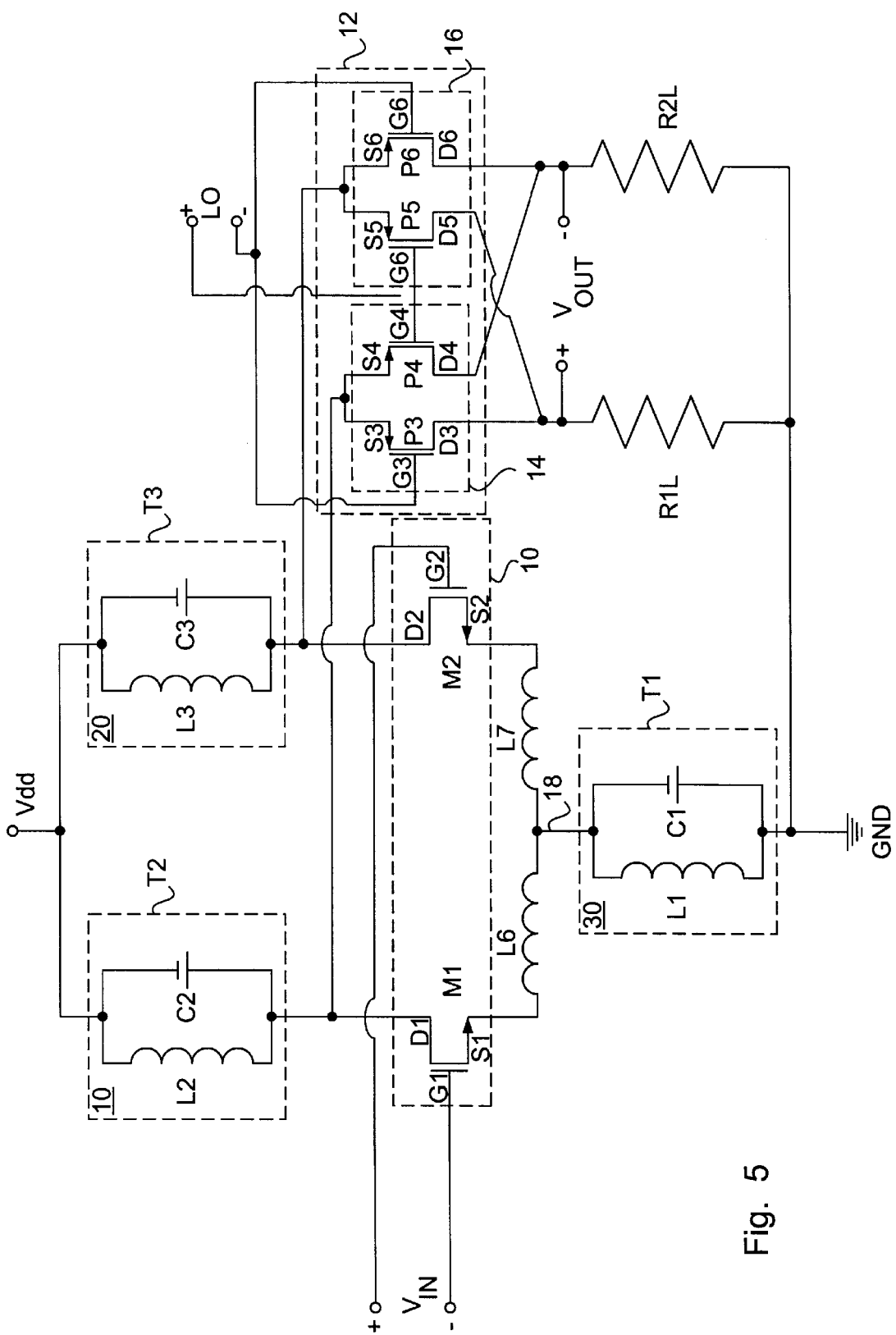
Figure 6:
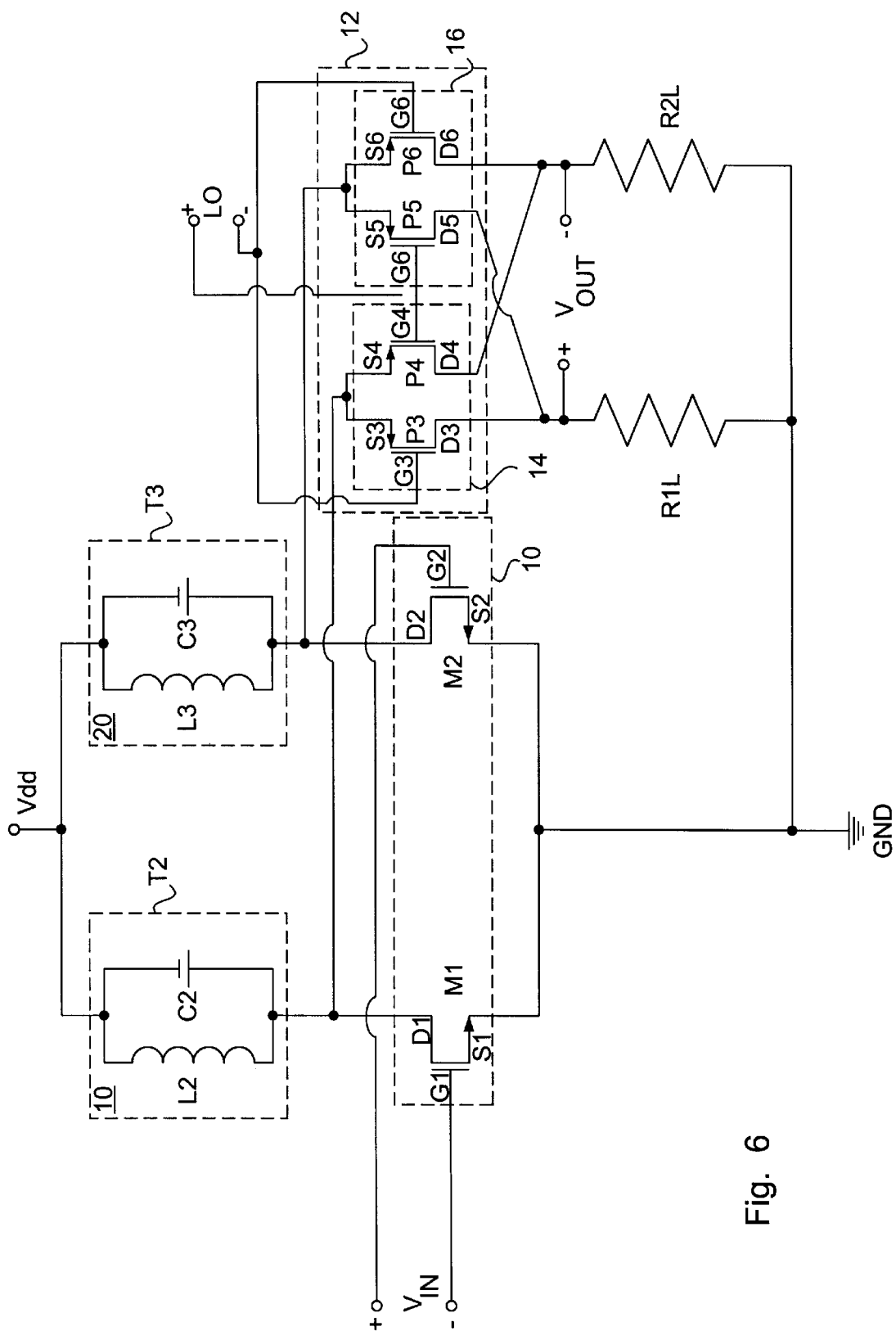

Many mixers circuits can be derived from that of FIG. 3. This will depend on the application and the design requirements as follows: The inductors (L4,L5) and/or (L6,L7) are only needed for setting the input impedance of the mixer to the desired value. These inductors could be replaced by short circuits if impedance matching is not required. For example, FIG. 4 shows the mixer with all the impedance matching inductors removed. In FIG. 5 another example is shown in which only the inductors L6 and L7 are included to increase the linearity of the mixer and to have a partial impedance matching. The tank circuit of (L1,C1) is only needed to have a common-mode node for the source coupled transistor pair of M1 and M2. If the incoming RF signal is balanced around a DC bias voltage, then the tank circuit of (L1,C1) could be replaced by a short circuit as shown in FIG. 6. The inductors (L4,L5,L6 and L7) could still be incorporated or omitted depending on the impedance matching requirements.

Any of the above described circuits can be used as mixers or amplifiers with the appropriate selection of the input signals.

Various power supply permutations are possible. The important issue here is that the supply rail Vdd be higher (positive) relative to the supply rail GND. Therefore, it is possible to replace GND with Vss, such that Vdd and Vss could take any values provided that Vdd is higher than Vss.

What is claimed is:

1. An apparatus comprising:
   a tank circuit having a resonance frequency, having a first end for connection to a first supply terminal and having a second end, the tank circuit consisting of a narrowband complex impedance having a very low DC resistance and having a high impedance in a range of frequency around said resonance frequency;
   an n-channel MOS transistor having a gate for receiving a first input signal, and a drain connected to the second end of the tank circuit;
   a p-channel MOS transistor having a drain for connection across a load to a second supply terminal, a source connected to the second end of the tank circuit, and a gate for receiving a second input signal;
   wherein the apparatus multiplies the second input signal with the first input signal only within said range of frequency.

2. An apparatus according to claim 1 wherein said tank circuit comprises a capacitor and an inductor connected together in parallel.

3. An apparatus comprising:
   a tank circuit having a resonance frequency, having a first end for connection to a first supply terminal and having a second end, the tank circuit consisting of a narrowband complex impedance having a very low DC resistance and having a high impedance in a range of frequency around said resonance frequency;
   a first transistor having first, second and third terminals, with the first terminal for receiving a first input signal, and the second terminal connected to the second end of the tank circuit;
   a second transistor of complementary type to said first transistor having first, second and third terminals, with the second terminal for connection across a load to a second supply terminal, the third terminal connected to the second end of the tank circuit, and the first terminal for receiving a second input signal;

wherein the apparatus multiplies the second input signal with the first input signal only within said range of frequency.

4. An apparatus according to claim 3 wherein said tank circuit comprises a capacitor and an inductor connected together in parallel.

5. An apparatus according to claim 3 wherein:

said first transistor is an npn bipolar junction transistor having a base, collector and emitter as the first transistor's first, second and third terminals respectively; and said second transistor is an pnp bipolar junction transistor having a base, collector and emitter as the second transistor's first, second and third terminals respectively.

6. An apparatus comprising:

a first tank circuit having a very low DC resistance and having a high impedance in a range of frequency around a resonance frequency, and having a first end for connection to a first supply terminal and having a second end;

a second tank circuit having a very low DC resistance and having a high impedance in said range of frequency, and having a first end for connection to the first supply terminal and having a second end;

a first transistor having first, second and third terminals, the second terminal connected to the second end of the first tank circuit, the third terminal for connection to a second supply terminal and the first terminal for receiving a first end of a first differential input signal;

a second transistor of the same type as said first transistor and having first, second and third terminals, the second terminal connected to the second end of the second tank circuit, the third terminal for connection to the second supply terminal, and the first terminal for receiving a second end of said first differential input signal;

a first differential pair of transistors of complementary type to said first and second transistors, and each of the pair having respective first, second and third terminals, the third terminals connected together and to the second end of the first tank circuit, the first terminals for connection to a second differential input signal, one of said second terminals for connection to the second supply terminal through a first load; and a second differential pair of transistors of the same type as said first differential pair of transistors, and each of the pair having respective first, second and third terminals, the third terminals connected together and to the second end of the second tank circuit, the first terminals of the first differential pair cross-connected with the first terminals of the second differential pair, one of said second terminals for connection to the second supply terminal through a second load; the second terminals of the first differential pair being cross-connected with the second terminals of the second differential pair.

7. An apparatus according to claim 6 wherein:

said first and second transistors are npn bipolar junction transistors each having a respective base, collector and emitter as the respective first and second transistor's first, second and third terminals respectively; and said first and second differential pairs of transistors are pnp bipolar junction transistor differential pairs of transistors, each pnp transistor in each pair having a base, collector and emitter as its first, second and third terminals respectively.

8. An apparatus according to claim 6 wherein:

said first and second transistors are a n-channel MOS transistors each having a respective gate, drain and source as the respective first and second transistor's first, second and third terminals respectively; and said first and second differential pairs of transistors are p-channel MOS differential pairs of transistors, each transistor in each pair having a base, collector and emitter as its first, second and third terminals respectively.

9. An apparatus according to claim 6 wherein each said tank circuit comprises a respective capacitor and a respective inductor connected together in parallel.

10. An apparatus according to claim 6 further comprising:

a first input matching inductor having a first end for receiving said first end of the first differential input signal and a second end connected to said first terminal of said first transistor and a second input matching inductor having a first end for receiving said second end of the first differential input signal and a second end connected to said first terminal of said second transistor.

11. An apparatus according to claim 6 further comprising:

a first degeneration inductor having a first end for connection to said second supply terminal and a second end connected to said third terminal of the first transistor; and a second degeneration inductor having a first end for connection to said second supply terminal and a second end connected to said third terminal of the second transistor.

12. An apparatus according to claim 6 further comprising:

a third tank circuit having a very low DC resistance;
wherein the connections of said third terminals of said first and second transistors to the second supply terminal are made through said third tank circuit.

13. An apparatus according to claim 12 wherein each said tank circuit comprises a respective capacitor and a respective inductor connected together in parallel.

14. An apparatus according to claim 7 further comprising a third tank circuit having a very low DC resistance, a first degeneration inductor and a second degeneration inductor; wherein:

the connection of said third terminal of said first transistor to the second supply terminal is made through the first degeneration inductor and the third tank circuit; and the connection of said third terminal of said second n-transistor to the second supply terminal is made through the second degeneration inductor and the third tank circuit.

15. An apparatus according to claim 14 further comprising:

a first input matching inductor having a first end for receiving said first end of the first differential input signal and a second end connected to said first terminal of said first transistor and a second input matching inductor having a first end for receiving said second end of the first differential input signal and a second end connected to said first terminal of said second transistor.

16. An apparatus according to claim 15 wherein each said tank circuit comprises a respective capacitor and a respective inductor connected together in parallel.

17. An apparatus according to claim 6 connected to operate as an amplifier having a gain.

18. An apparatus according to claim 17 wherein said first power supply terminal is connected to a positive power supply terminal and said second power supply terminal is connected to a negative power supply terminal, and wherein said second differential signal is a bias DC voltage controlling the gain of the amplifier which is applied to the input signal.

19. An apparatus according to claim 6 connected to operate as a mixer.

20. An apparatus according to claim 19 wherein said first power supply terminal is connected to a positive power supply terminal and said second supply terminal is connected to a negative power supply terminal, and wherein said second differential signal is an alternating signal which is mixed with the input signal.

* * * * *